(12) United States Patent
Folkner et al.

(10) Patent No.: US 10,185,021 B2
(45) Date of Patent: Jan. 22, 2019

(54) NON-CONTACT MAGNETOSTRICTIVE SENSOR ALIGNMENT METHODS AND SYSTEMS

(71) Applicant: General Electric Company, Schenectady, NY (US)

(72) Inventors: David Erik Folkner, Gardnerville, NV (US); Dan Tho Lu, Minden, NV (US); Lysle Turnbeaugh, Gardnerville, NV (US); Brian Howard, Reno, NV (US)

(73) Assignee: General Electric Company, Schenectady, NY (US)

( * ) Notice: Subject to any disclaimer, the term of this patent is extended or adjusted under 35 U.S.C. 154(b) by 65 days.

(21) Appl. No.: 15/378,503

(22) Filed: Dec. 14, 2016

(65) Prior Publication Data

US 2018/0164396 A1 Jun. 14, 2018

(51) Int. Cl.
*G01R 33/04* (2006.01)
*G01R 35/00* (2006.01)
*G01L 1/12* (2006.01)
*G01L 25/00* (2006.01)

(52) U.S. Cl.
CPC ............ *G01R 35/005* (2013.01); *G01L 1/125* (2013.01); *G01L 25/00* (2013.01)

(58) Field of Classification Search
CPC ....... G01R 35/005; G01L 1/125; G01L 25/00; G01L 1/25
USPC ......................................................... 324/202
See application file for complete search history.

(56) References Cited

U.S. PATENT DOCUMENTS

| 4,731,582 A | 3/1988 | Posseme et al. |
| 5,542,304 A * | 8/1996 | Sasada .................. B23Q 17/09 73/862.06 |
| 6,494,102 B2 * | 12/2002 | Hanisko ................. G01L 3/102 73/779 |
| 9,212,958 B2 * | 12/2015 | Campbell ............... G01L 1/125 |
| 9,217,682 B2 | 12/2015 | Brummel et al. |

(Continued)

FOREIGN PATENT DOCUMENTS

| CN | 104142365 A | 11/2014 |
| KR | 10-2015-0133925 A | 12/2015 |

OTHER PUBLICATIONS

International Search Report and Written Opinion issued in connection with corresponding PCT Application No. PCT/US2017/066137 dated Mar. 30, 2018.

*Primary Examiner* — Reena Aurora
(74) *Attorney, Agent, or Firm* — Mintz Levin Cohn Ferris Glovsky and Popeo, P.C.

(57) ABSTRACT

A method for aligning a sensor with a conductive material includes inducing a first magnetic flux in the conductive material to generate a first magnetic field state, and receiving a first signal at a first signal output level from a first detector and a second signal at a second signal output level from a second detector at the first magnetic field state. The method also includes inducing a second magnetic flux in the conductive material to generate a second magnetic field state, and receiving a third signal at a third signal output level from the first detector and a fourth signal at a fourth signal output level from the second detector at the second magnetic field state. Moreover, the method includes, based on changes in the signal output levels, adjusting a position of the sensor relative to the conductive target material to adjust the signal output levels to desired levels.

20 Claims, 11 Drawing Sheets

(56) References Cited

U.S. PATENT DOCUMENTS

2014/0366637 A1 12/2014 Brummel et al.
2015/0247903 A1 9/2015 Maurio et al.

* cited by examiner

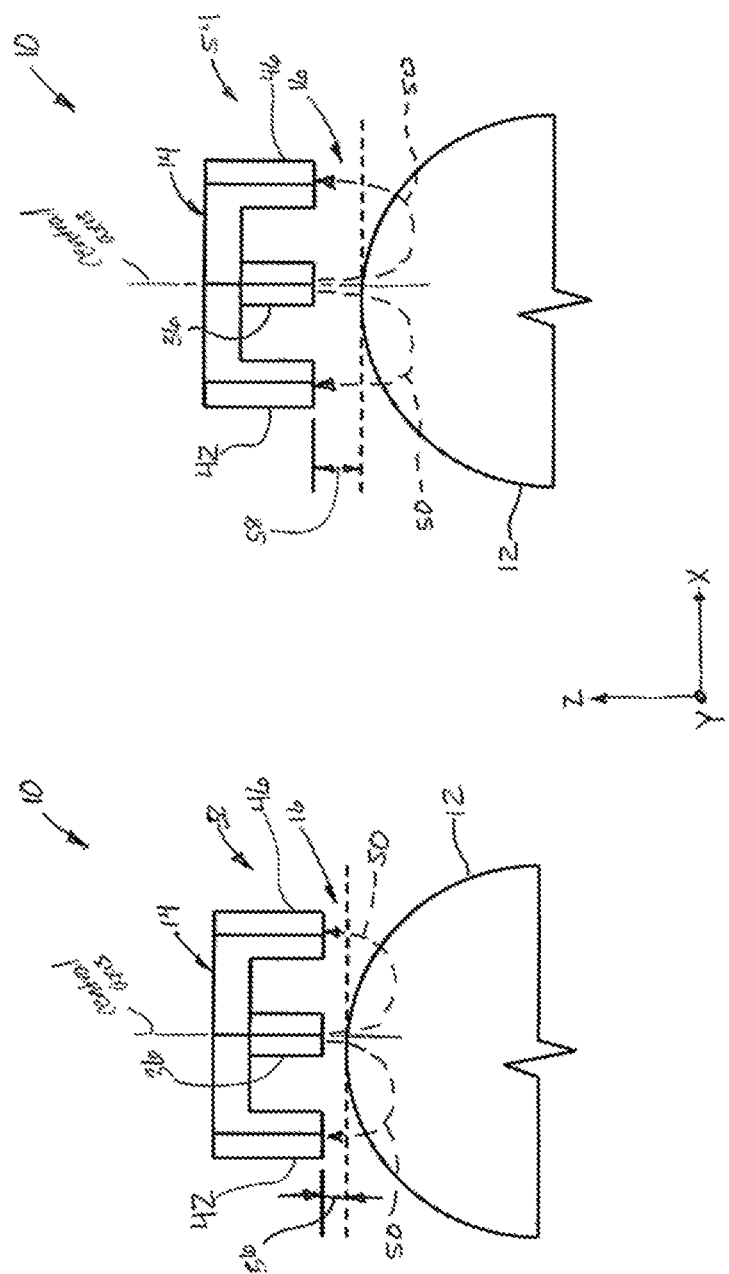

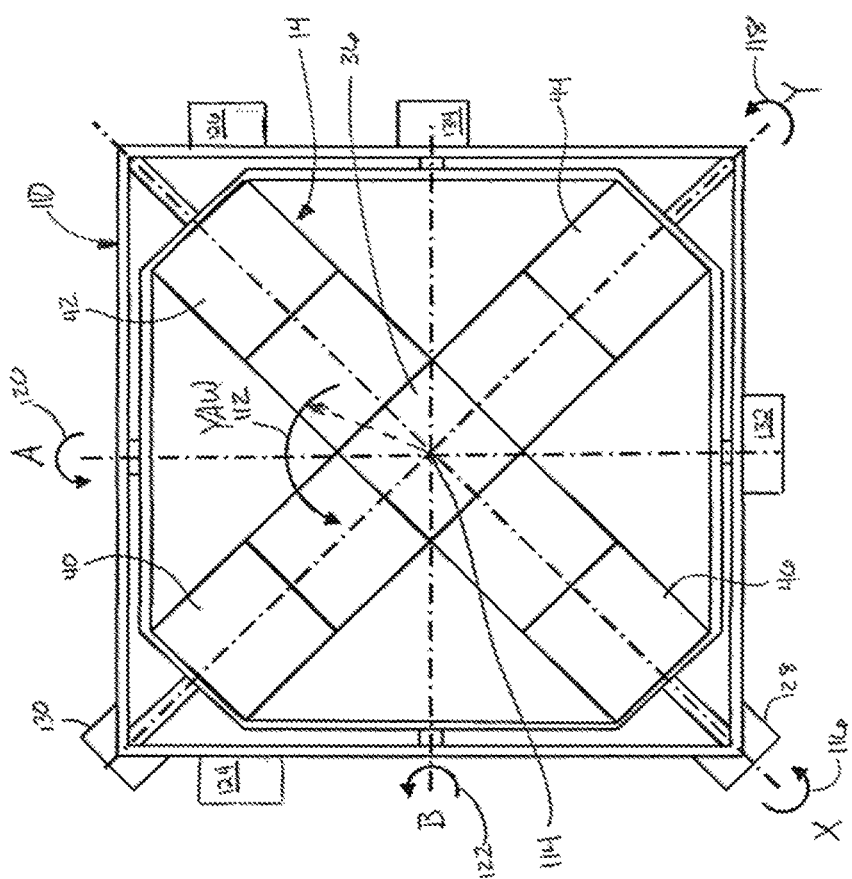
FIG. 5
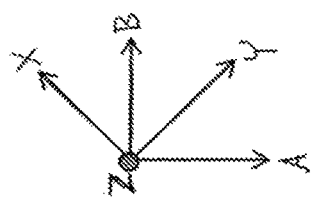

NON-CONTACT MAGNETOSTRICTIVE SENSOR ALIGNMENT METHODS AND SYSTEMS

BACKGROUND

Conductive materials have magnetostrictive properties that cause the materials to change shape in the presence of an applied magnetic field. The inverse is also true. When a force is applied to a conductive material, the magnetic properties, such as magnetic permeability, of the material change. A magnetostrictive sensor may sense the changes in magnetic permeability and, because the changes are proportional to the amount of stresses applied to the conductive material, the resulting measurement may be used to calculate the amount of stress.

The changes in the magnetic permeability as a result of stress being applied to the conductive material, however, may be small, making accurate measurement difficult. At least some known magnetostrictive sensors are manually aligned and a gap is set by a gauge. Such alignment can result in different air gaps being defined between each detector pole of the sensor. In such known magnetostrictive sensors, a computing system may be used to offset the sensor detection values to attempt to accommodate misalignment of the sensor. Such operations, however, can result in an inaccurate measure of stress in the conductive material, and/or can result in difficulty of calibrating the magnetostrictive sensing system.

SUMMARY

The subject matter described herein relates generally to stress sensing in conductive materials, and more particularly, to methods and systems for use in aligning non-contact sensors with conductive materials.

In one aspect, a method for aligning a sensor with a conductive target material is provided. The method includes inducing a first magnetic flux in the conductive target material to generate a first magnetic field state, and receiving a first signal at a first output level from a first detector of the sensor and a second signal at a second output level from a second detector of the sensor at the first magnetic field state. The method also includes inducing a second magnetic flux in the conductive target material to generate a second magnetic field state, and receiving a third signal at a third output level from the first detector of the sensor and a fourth signal at a fourth output level from the second detector of the sensor at the second magnetic field state. The method further includes, based on changes in the signal output levels, adjusting a position of the sensor relative to the conductive target material to adjust the signal output levels to desired levels.

In another aspect, another method for aligning a sensor with a conductive target material is provided. The method includes adjusting a magnetic flux in the conductive target material to change a first magnetic field state to a second magnetic field state, and detecting a first change in a magnetic flux using a first detector of a first pair of detectors of the sensor. The first change in the magnetic flux corresponds to the change of the magnetic field state. The method also includes detecting a second change in the magnetic flux using a second detector of the first pair of detectors of the sensor. The second change in the magnetic flux corresponds to the change of the magnetic field state. In addition, the method includes comparing the first change in a magnetic flux to the second change in a magnetic flux. The method further includes, based on the comparison of the first change in the magnetic flux to the second change in the magnetic flux, adjusting a position of the sensor to alter the relative position of the sensor to the conductive target material such that the first change and the second change are set to desired output levels.

In yet another aspect, a system to aid in aligning a sensor to a conductive target material is provided. The system includes a conductive target material and a sensor positioned proximate to the conductive target material. The sensor includes an excitation source configured to induce a magnetic flux in the conductive target material, a first detector configured to detect the magnetic flux, and a second detector configured to detect the magnetic flux. The system also includes an adjustment apparatus configured to adjust an orientation of the sensor relative to the conductive target material between a first orientation and a second orientation. Furthermore, the system includes a controller coupled in communication with the sensor. The controller is configured to receive a first signal from the first detector and a second signal from the second detector at a first magnetic field state, and receive a third signal from the first detector and a fourth signal from the second detector at a second magnetic field state. In addition, the controller is configured to, based on a change in at least one of the first, second, third, or fourth signals, determine an amount of adjustment to move the adjustment apparatus from the first orientation to the second orientation.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 2 is a schematic end view of the stress sensing system shown in FIG. 1 and showing a first gap orientation;

FIG. 3 is a schematic end view of the stress sensing system shown in FIG. 1 and showing a second gap orientation;

FIG. 5 is a schematic plan view of an exemplary sensor head used with the stress sensing system shown FIG. 1 and mounted to an adjustment apparatus;

FIG. 12 is a schematic of an exemplary presentation device that may be used with the controller shown in FIG. 11.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

Unless otherwise indicated, approximating language, such as "generally," "substantially," and "about," as used herein indicates that the term so modified may apply to only an approximate degree, as would be recognized by one of ordinary skill in the art, rather than to an absolute or perfect degree. Approximating language may be applied to modify any quantitative representation that could permissibly vary without resulting in a change in the basic function to which it is related. Accordingly, a value modified by a term or terms, such as "about," "approximately," and "substantially," is not to be limited to the precise value specified. In at least some instances, the approximating language may correspond to the precision of an instrument for measuring the value. Here and throughout the specification and claims, range limitations are identified. Such ranges may be combined and/or interchanged, and include all the sub-ranges contained therein unless context or language indicates otherwise.

Additionally, unless otherwise indicated, the terms "first," "second," etc. are used herein merely as labels, and are not intended to impose ordinal, positional, or hierarchical requirements on the items to which these terms refer. Moreover, reference to, for example, a "second" item does not require or preclude the existence of, for example, a "first" or lower-numbered item or a "third" or higher-numbered item.

As used herein, the term "magnetic permeability" includes the relative increase or decrease in the magnetic flux inside a material compared with the magnetic field in which the material is located.

The present disclosure provides techniques that may be used in aligning torque sensors with a shaft. In particular, the disclosure provides a method for electrically aligning and balancing the sensor during installation. The technique includes monitoring the changes in voltages of each detector of the torque sensor as the air gap between the sensor and the shaft is changed. Data received from the detectors enables the identification of any misalignment of the sensor and provides to a user steps for correcting the alignment. Accurate alignment of the sensor improves accuracy and helps with the calibration of the sensor system. Other embodiments are within the scope of the disclosure.

Figure 1:
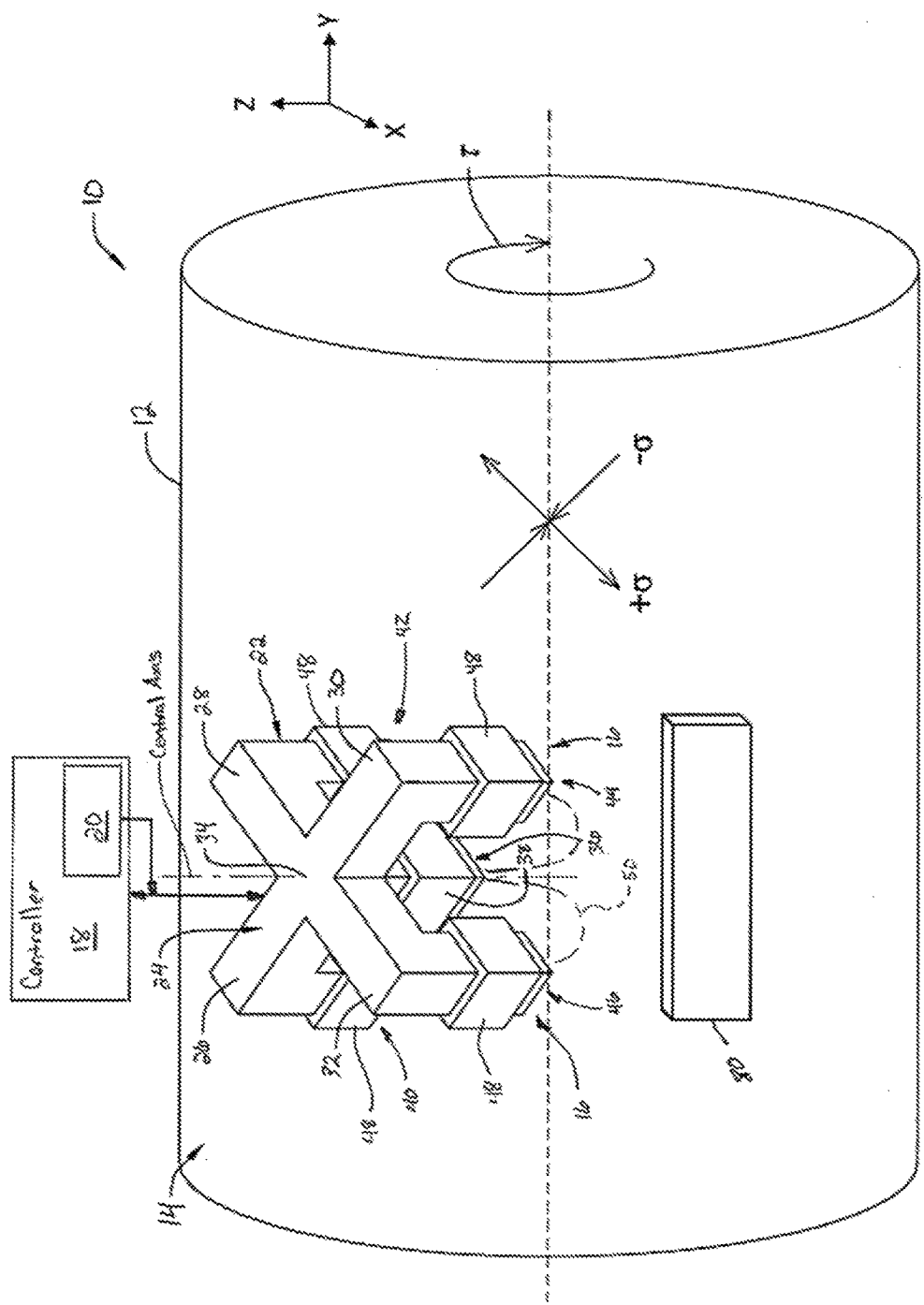
FIG. 1 is a schematic view of an exemplary system for sensing stresses induced in a conductive material.

FIG. 1 is a schematic view of an exemplary stress sensing system 10 for sensing stresses induced in a conductive target material 12. FIG. 2 is a schematic end view of stress sensing system 10 in a first gap orientation 52. FIG. 3 is a schematic end view of stress sensing system 10 in a second gap orientation 54. In the exemplary embodiment, stress sensing system 10 includes a sensor head, generally indicated at 14, and a conductive target material 12, for example, and without limitation, a rotatable shaft. Sensor head 14 can include a central axis and is typically generally symmetrical. In such an embodiment, stress sensing system 10 can be a torque sensing system. Alternatively, stress sensing system 10 can be any type of stress sensing system that is capable of sensing stress in any type of conductive target material. In the exemplary embodiment, sensor head 14 can be positioned proximate to rotatable shaft 12 such that an air gap 16 is defined between sensor head 14 and rotatable shaft 12. Sensor head 14 can be coupled to adjustment apparatus 110 (shown in FIG. 5) to facilitating positioning and maintaining sensor head 14 in a proper orientation and alignment with rotatable shaft 12. In addition, sensor head 14 can be coupled to a controller 18 that includes a power supply component 20 for supplying the electrical current necessary to generate a magnetic flux used for sensing stress in rotatable shaft 12.

In some alternative embodiments, additional sensors (not shown), for example proximity, magnetic field, and/or temperature, may be positioned proximate to rotatable shaft 12. Proximity sensors may be used to monitor an air gap 16 defined between rotatable shaft 12 and sensor head 14. Additional magnetometers may be used to monitor background magnetic fields, for example, and without limitation, the earth's magnetic field and extraneous electromagnetic interference (EMI). In addition, temperature sensors may be used to monitor temperature changes, including ambient environment, sensor head 14, and/or rotatable shaft 12. Gap changes in air gap 16, background EMI, and/or temperature changes may affect the signal received by one or more detection coils 48. By monitoring air gap 16, temperature changes, and background EMI, a magnitude of the assorted effects may be substantially reduced by controller 18.

In the exemplary embodiment, power supply 20 can include, for example, and without limitation, at least one of a battery, a wireless power supply device, and/or a wired power supply device. In one alternative embodiment, the battery can transmit power to sensor head 14 through controller 18. In another alternative embodiment, the wireless power supply device can include any power source that enables operation of stress sensing system 10 as described herein, such as, but without limitation, an inductive power supply. The wireless power supply device can be located separately from sensor head 14. Alternatively, the wireless power supply device may be positioned in any location that enables stress sensing system 10 to operate as described herein. Moreover, in another alternative embodiment, the wired power supply device can be configured to transmit power directly to sensor head 14 via one or more power cables (not shown). Furthermore, in other alternative embodiments, the wireless and wired power supply devices may include a battery that may be used to transmit power to stress sensing system 10 during a power failure. In such alternative embodiments, during normal operation of stress sensing system 10, the battery may be in a stand-by mode.

In the exemplary embodiment, sensor head 14 typically includes a core 22. Core 22 may be fabricated from any magnetic or ferromagnetic material, for example, and without limitation, iron. Core 22 can include a cross-axis yoke 24. In addition, in the exemplary embodiment, core 22 typically includes four members 26, 28, 30, and 32 that each extend planarly outward from a yoke portion 34. The four members 26, 28, 30, and 32 can be oriented substantially orthogonally to each other around yoke portion 34. Furthermore, each of the four members 26, 28, 30, and 32 may terminate in an end that is distal from yoke portion 34. In alternative embodiments, yoke 24 can include any number of members and any orientation that enables yoke 24 to operate as described herein. Furthermore, each member may extend from yoke portion 34 in any configuration and for any length that enables each member to operate as described herein. In addition, in alternative embodiments, sensor head 14 can be any type of sensor head and can have any form that enables stress sensing system 10 to function as described herein, such as, but not limited to, a magnetostrictive sensor formed on a PCB or having fewer or more than 4 poles.

In the exemplary embodiment, an excitation pole element 36 typically extends outward from yoke portion 34 perpendicular to a planar surface defined by yoke 24. In addition, four detector pole elements 40, 42, 44, and 46 each can extend outward from yoke 24 and each can be substantially perpendicular to the planar surface defined by yoke 24 and substantially parallel to excitation pole element 36. In the exemplary embodiment, detector pole element 40 can extend from a distal end of member 26, detector pole element 42 can extend from the distal end of member 28, detector pole element 44 can extend from a distal end of member 30, and detector pole element 46 can extend from a distal end of member 32. In alternative embodiments, core 22 may include any number of pole elements extending from yoke 24 in any configuration that enables core 22 to function as described herein.

In the exemplary embodiment, sensor head 14 typically includes an excitation coil 38 wound about excitation pole element 36. In addition, a separate and discrete detection coil 48 can be typically wound respectively around detector pole elements 40, 42, 44, and 46. Specifically, one detection coil 48 can be wound about detector pole element 40, one detection coil 48 can be wound about detector pole element 42, one detection coil 48 can be wound about detector pole element 44, and one detection coil 48 can be wound about detector pole element 46. In the exemplary embodiment, during operation, an AC signal can be transmitted through excitation coil 38 to induce a magnetic flux 50 in rotatable shaft 12 to induce various magnetic field states of stress sensing system 10. Driving excitation coil 38 with an AC signal to induce magnetic flux 50 facilitates measuring both transient and steady state stress in rotatable shaft 12. Magnetic flux 50 typically flows from the excitation pole element 36, through rotatable shaft 12, and returns back to detector pole elements 40, 42, 44, and 46 where detection coils 48 can measure the amount of returning magnetic flux 50. In some embodiments, magnetic flux 50 can be adjusted by varying at least one of the voltage and the frequency of the AC signal transmitted through excitation coil 38. In addition, magnetic flux 50 can be adjusted by driving excitation coil 38 by both an AC and a DC signal, consecutively or simultaneously.

In the exemplary embodiment, a torque τ can be applied to rotatable shaft 12. Torque τ can induce stress along a direction offset ±45° from the axis of rotation of rotatable shaft 12. The stresses may include both a compressive stress −σ and a tensile stress +σ. The magnetic permeability of rotatable shaft 12 is typically different in a direction of compressive stresses as compared with a direction of tensile stresses. Detection coils 48 can be oriented to measure the difference in magnetic permeability. In the exemplary embodiment, torque τ can be a force applied to rotatable shaft 12. Although, other external forces may be applied to rotatable shaft 12 and measured by stress sensing system 10.

With reference to FIGS. 2 and 3, sensor head 14 is shown misaligned with rotatable shaft 12. In first gap orientation 52, air gap 16 is a first distance 56 between excitation pole element 36 and rotatable shaft 12. Detector pole element 46 has an increased air gap 16 as compared to detector pole element 42, thus detector pole element 46 may receive a larger portion of a total amount of magnetic flux 50. As air gap 16 is increased to second distance 58, as illustrated in FIG. 3, detector pole element 46 may gain a larger percentage of total magnetic flux 50. As such, detector pole elements 40, 42, 44, and 46, each can output a different voltage to controller 18 based, in part, on air gap 16. In at least some embodiments, controller 18 can accommodate the different voltage output of detector pole elements 40, 42, 44, and 46, to compensate for slight differences in air gap 16. However, in other embodiments, large discrepancies in air gap 16 between detector pole elements 40, 42, 44, and 46 cannot be accommodated by controller 18.

Figure 4:
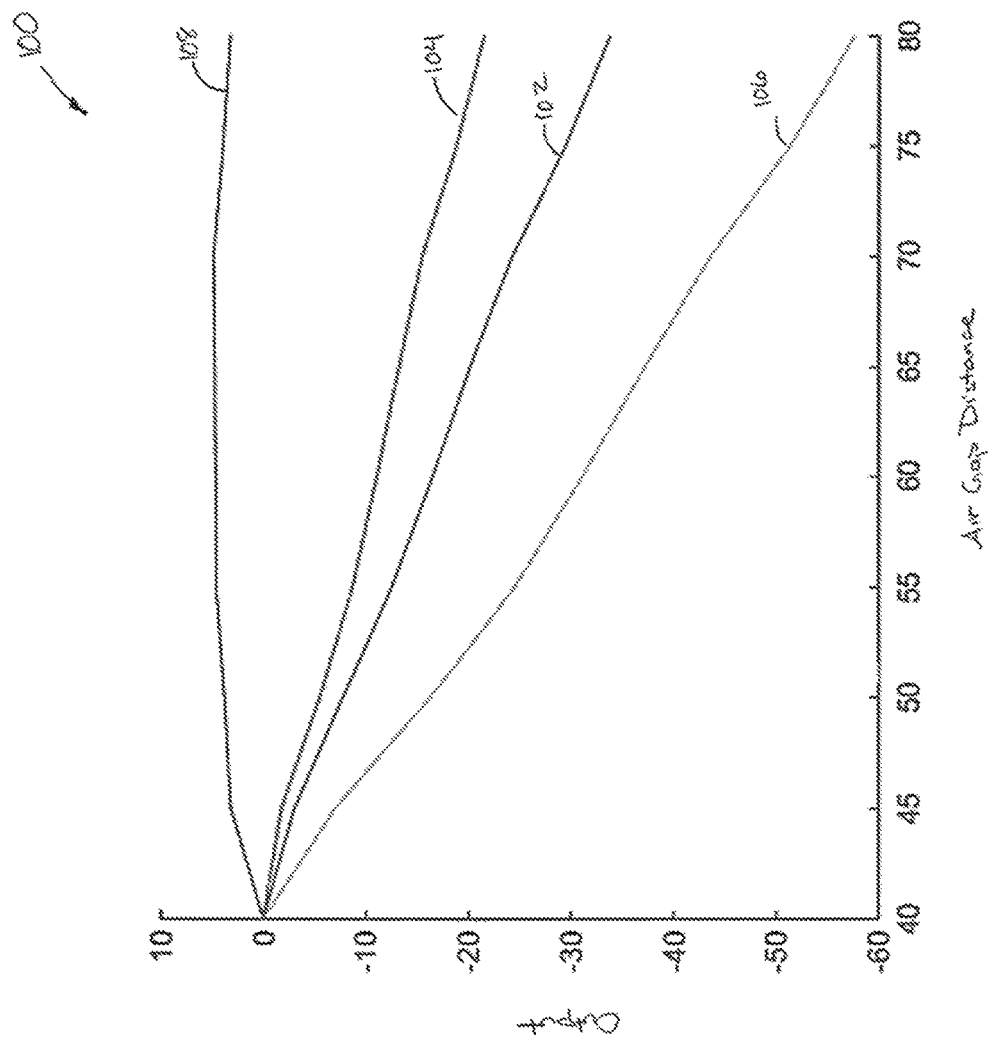
FIG. 4 is an exemplary plot of output versus air gap distances for a plurality of detector pole elements of a sensor head of the stress sensing system shown in FIG. 1, as the sensor head is moved from the first gap orientation shown in FIG. 2 to the second gap orientation shown in FIG. 3.

FIG. 4 is an exemplary plot 100 of output versus air gap 16 distances for detector pole elements 40, 42, 44, and 46 of sensor head 14 as sensor head 14 is moved from first gap orientation 52 to second gap orientation 54. In the exemplary embodiment, as air gap 16 is increased (i.e., sensor head 14 is moved away from rotatable shaft 12 in the "Z" direction), detector pole element pole signals 102, 104, 106, and 108, should decrease as a result of a reduction in magnetic flux 50 measured by each detector pole element 40, 42, 44, and 46, respectively. As illustrated in plot 100, however, some gap orientations, such as first gap orientation 52 to second gap orientation 54, can result in at least one detector pole element pole signal (e.g., detector pole element pole signal 108) increasing. This is indicative of a particularly poor alignment of the sensor head 14 such that an air gap 16 defined between each detector pole element 40, 42, 44, and 46 varies an increased amount.

As described herein, detector pole element pole signals 102, 104, 106, 108 can be correlated to the air gap 16 defined between detector pole elements 40, 42, 44, and 46 and rotatable shaft 12. For example, and without limitation, in one embodiment, as air gap 16 is increased relative to a respective detector pole elements 40, 42, 44, and 46, detector pole element pole signals 102, 104, 106, and 108, respectively, decrease, i.e., become more negative. In particular, the closer each respective detector pole elements 40, 42, 44, and 46 is with respect to rotatable shaft 12, the more negative the respective detector pole element pole signals 102, 104, 106, 108 can become as air gap 16 is increased. For example, as shown in FIG. 4, detector pole element 44 is the closest to rotatable shaft 12 as indicated by corresponding detector pole element pole signal 106, whereas detector pole element 46 is furthest from rotatable shaft 12 as indicated by corresponding detector pole element pole signal 108. Detector pole elements 40 and 42 each have an air gap 16 between that of detector pole elements 44 and 46, as is indicated by detector pole element pole signals 102 and 104, respectively. To correct the discrepancies in detector pole element pole signal readings, in the exemplary embodiment, sensor head 14 can be aligned with rotatable shaft 12 such that each of detector pole elements 40, 42, 44, and 46 can be approximately an equal distance away from rotatable shaft 12.

FIG. 5 is a schematic plan view of sensor head 14 mounted to an exemplary adjustment apparatus 110 having multiple degrees of freedom. In the exemplary embodiment, adjustment apparatus 110 can include adjustment for at least yaw, as indicated by arrow 112. Yaw enables rotation of sensor head 14 about the central axis (i.e., the Z-axis), as indicated in FIG. 5 as center point 114, of sensor head 14. In addition, adjustment apparatus 110 typically enables sensor head 14 to be rotated about the X and Y axes, as indicated by arrows 116 and 118, respectively. In the exemplary embodiment, the X axis is aligned with detector pole elements 42 and 46 and may be referred to as the pitch axis, and the Y axis is aligned with detector pole elements 40 and 44 and may be referred to as the roll axis. In an alternative embodiment, adjustment apparatus 110 can enable sensor head 14 to be rotated about optional A and B axes, as indicated by arrows 120 and 122, respectively. Optional A and B axes are positioned at 45° angles with respect to the X and Y axes. Alternative, adjustment apparatus 110 can enable sensor head 14 to be rotated about each axis A, B, X, and Y, and/or any other axes that enables stress sensing system 10 to function as described herein. Furthermore, in the exemplary embodiment, adjustment apparatus 110 is typically moveable about the Z axis, thereby enabling air gap 16 to be adjusted with respect to sensor head 14. That is, adjustment apparatus 110 typically enables sensor head 14 to be moved nearer or farther away from rotatable shaft 12.

In the exemplary embodiment, yaw adjustments can be controlled by a yaw actuator 124. Yaw actuator 124 can be one of a mechanical actuator or a drive motor attached to a threaded adjustment assembly (not shown). For example, and without limitation, the mechanical actuator can include a knob or wheel that is manually operated by an operator, and the drive motor can include one of a servomotor or linear stepping motor automatically operated to effect the relative positioning of sensor head 14. In addition, Z axis control can be controlled by a Z-axis actuator 126. As with yaw actuator 124, Z-axis actuator 126 can be one of a mechanical actuator or a drive motor attached to a threaded adjustment assembly as described above. Moreover, rotation of sensor head 14 about each of X and Y axes can be controlled by a respective X-axis actuator 128 and a Y-axis actuator 130. In the exemplary embodiment, X-axis actuator 128 and a Y-axis actuator 130 can be each one of a mechanical actuator or a drive motor attached to a threaded adjustment assembly, as described above. In alternative embodiments, rotation of sensor head 14 about each of A and B axes can be controlled by an A-axis actuator 132 and a B-axis actuator 134, respectively. A-axis actuator 132 and a B-axis actuator 134 can be each one of a mechanical actuator or a drive motor attached to a threaded adjustment assembly, as described above. Adjustment of adjustment apparatus 110 can be controlled manually by a user, and/or automatically by controller 18 (shown in FIG. 1).

Figure 6:
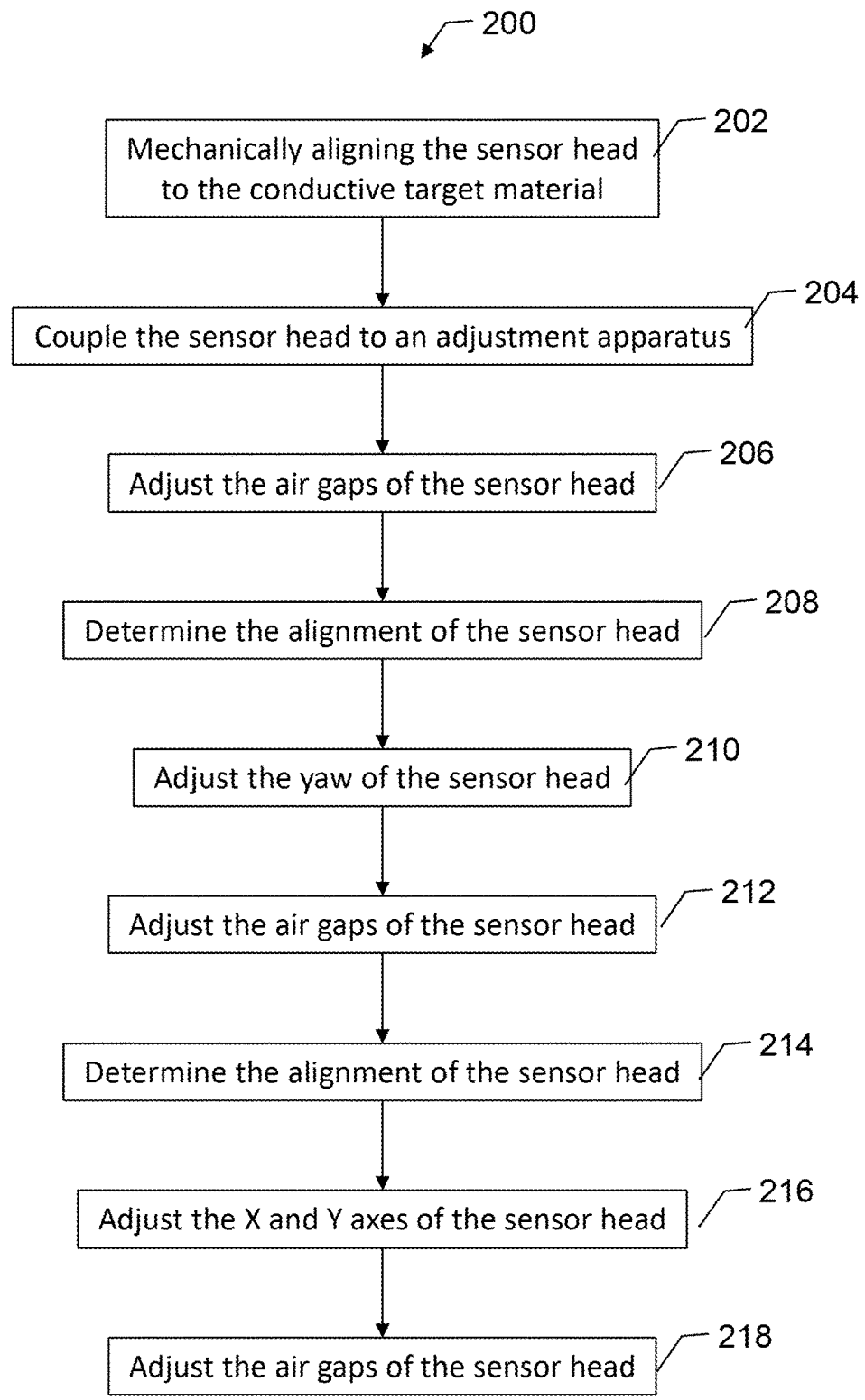
FIG. 6 is a block diagram of an exemplary method for aligning detector pole elements of the sensor head used with the stress sensing system shown in FIG. 1 with the conductive material shown in FIG. 1.

FIG. 6 is a block diagram of an exemplary method 200 that facilitates mechanically aligning detector pole elements 40, 42, 44, and 46 of sensor head 14 with rotatable shaft 12, such that an air gap 16 can be maintained generally consistent between each detector pole element 40, 42, 44, and 46. Method 200 typically includes mechanically aligning 202 sensor head 14 to rotatable shaft 12, for example, by using a fixture (e.g., a v-block) to position sensor head 14. Sensor head 14 can be mechanically coupled 204 to adjustment apparatus 110 to facilitate maintaining the alignment of sensor head 14, and to enable fine adjustment of a position of sensor head 14. In the exemplary embodiment, after mechanical alignment of sensor head 14 is completed, air gap 16 of sensor head 14 can be swept or adjusted 206 and the resulting data or detector pole element pole signals 102, 104, 106, and 108 from detector pole elements 40, 42, 44, and 46 are captured by controller 18 to determine 208 the alignment of sensor head 14.

In one embodiment, after mechanical alignment of sensor head 14 is completed and detector pole element pole signals 102, 104, 106, and 108 data is gathered, the yaw of sensor head 14 can be adjusted 210. During alignment of sensor head 14, it is desirable to have each detector pole element pole signal 102, 104, 106, and 108 collapse, or to generally provide a similar output as air gap 16 changes. The yaw adjustment typically facilitates aligning opposite poles, or pole pairs, such as detector pole elements 40 and 44, and detector pole elements 42 and 46. After the yaw adjustment is completed, air gap 16 of sensor head 14 can be swept or adjusted 212 and the resulting data or detector pole element pole signals 102, 104, 106, and 108 from detector pole elements 40, 42, 44, and 46 can be captured by controller 18 to further determine 214 the alignment of sensor head 14. The X and Y axes can be adjusted 216 to facilitate collapsing or aligning the pole pairs, such as detector pole elements 40 and 44, and detector pole elements 42 and 46, into a generally similar alignment, i.e., a generally similar air gap 16 distance. After each adjustment of sensor head 14, air gap 16 of sensor head 14 can be swept or adjusted 218 and the resulting data or detector pole element pole signals 102, 104, 106, and 108 from detector pole elements 40, 42, 44, and 46 can be captured by controller 18 to continuously determine the alignment of sensor head 14. It is noted that the adjustments and data collection can be done either manually by the user of stress sensing system 10, or the method steps can be included in controller 18 as a program or algorithm capable of receiving detector pole element pole signals 102, 104, 106, and 108, determining necessary adjustments, and/or effecting such adjustment using adjustment apparatus 110.

Figure 7:
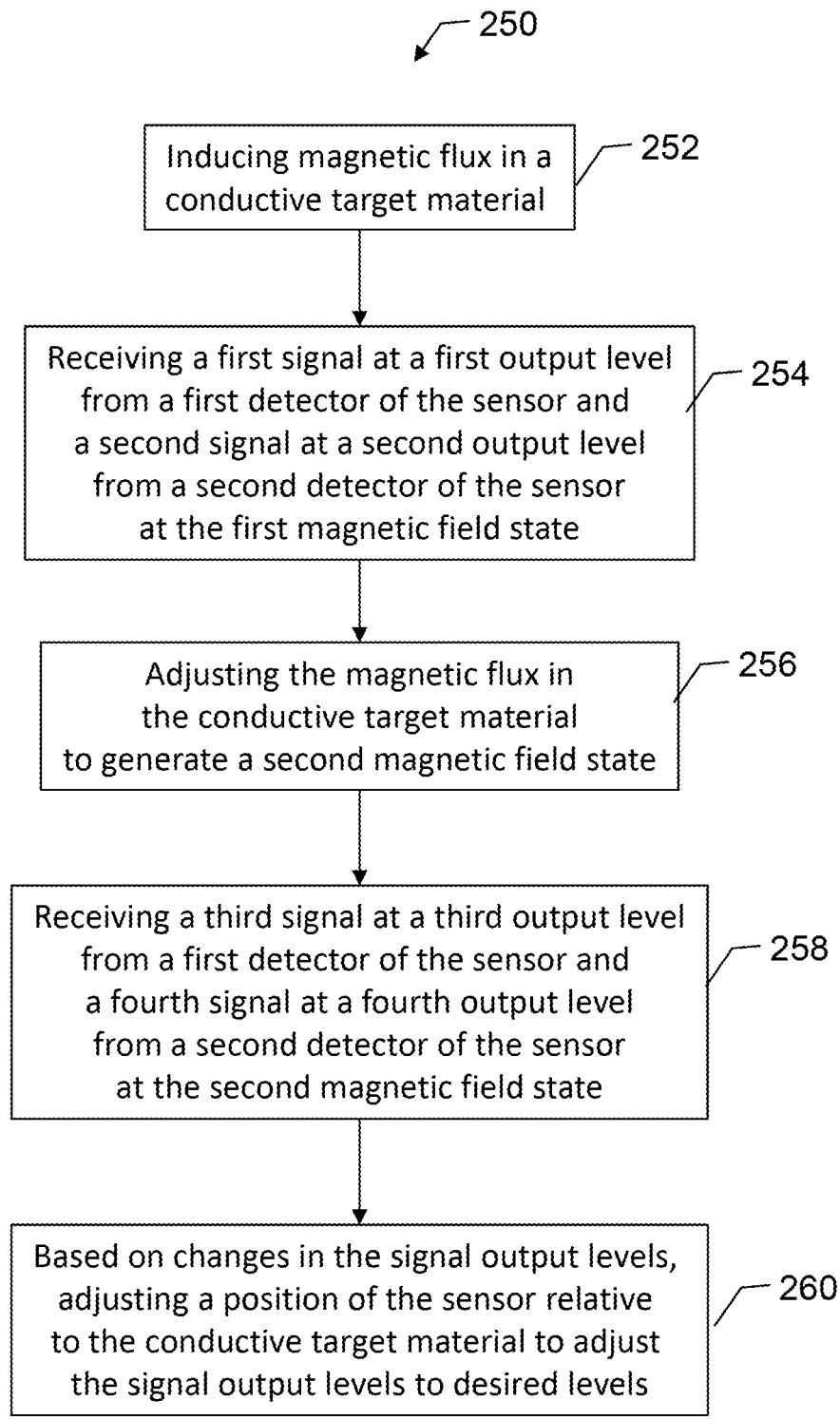
FIG. 7 is a block diagram of an alternative method for aligning the sensor head used with the stress sensing system shown in FIG. 1 with the conductive target material shown in FIG. 1.

FIG. 7 is a block diagram of an alternative method 250 for aligning sensor head 14 with the conductive target material, such as rotatable shaft 12. With reference to FIGS. 1, 5, and 7, in the exemplary embodiment, method 250 typically includes inducing 252 a first magnetic flux 50 in conductive target material 12 to generate a first magnetic field state. Magnetic flux 50 is typically induced in conductive target material 12 by actuating or driving excitation coil 38 with at least one of an AC signal or a DC signal, at one or more frequencies and/or voltages. Method 200 also typically includes receiving 254 a first signal from a first detector, such as at least one of detector pole element pole signals 102, 104, 106, and 108 from detector pole elements 40, 42, 44, and 46, at a first output level, and a second signal at a second output level from a second detector of sensor head 14 at the first magnetic field state. For example, an AC signal at a first frequency may be used to actuate excitation coil 38, thereby inducing magnetic flux 50 in conductive target material 12. Detector pole element 40 can measure magnetic flux 50 and can generate detector pole element pole signal 102 (i.e., a first signal at a first output level from a first detector), and detector pole element 44 can measure magnetic flux 50 and can generate detector pole element pole signal 106 (i.e., a second signal at a second output level from a second detector).

Method 250 also typically includes inducing 256 a second magnetic flux and/or adjusting magnetic flux 50 in conductive target material 12 to generate a second magnetic field state. Magnetic flux 50 can be induced and/or adjusted by changing at least one of the frequency and/or the voltage used to drive excitation coil 38, whether using an AC signal or a DC signal. In addition, magnetic flux 50 may be induced and/or adjusted by switching the signal between an AC signal and a DC signal. In some embodiments, magnetic flux 50 may be induced and/or adjusted by placing a magnetic field disruption component 80 proximate to sensor head 14 to facilitate disrupting, or changing, the magnetic flux 50 flowing through conductive target material 12. In addition, in other embodiments, magnetic flux 50 may be induced and/or adjusted by changing the material of conductive target material 12. For example, and without limitation, conductive target material 12 may include a first conductive target material and a second conductive target material, such that the material being sensed by sensor head 14 can be changed without disrupting the relative orientation of sensor head 14 to conductive target material 12.

In the exemplary embodiment, after magnetic flux 50 is adjusted, a third signal at a third output level from the first detector of sensor head 14 and a fourth signal at a fourth output level from the second detector of sensor head 14 can be received 258 at the second magnetic field state. This can be seen, for example, in FIG. 4, where each detector pole element pole signal 102, 104, 106, and 108, indicates a change in the output level as the magnetic field state (e.g., the air gap distance) changes. Based on changes in the signal output levels, such as detector pole element pole signals 102, 104, 106, and 108, a position of sensor head 14 relative to conductive target material 12 can be adjusted 260 to adjust the signal output levels to desired levels. A position of sensor head 14 can be moved by adjusting adjustment apparatus 110 about one or more of its axis of freedom.

Figure 8:
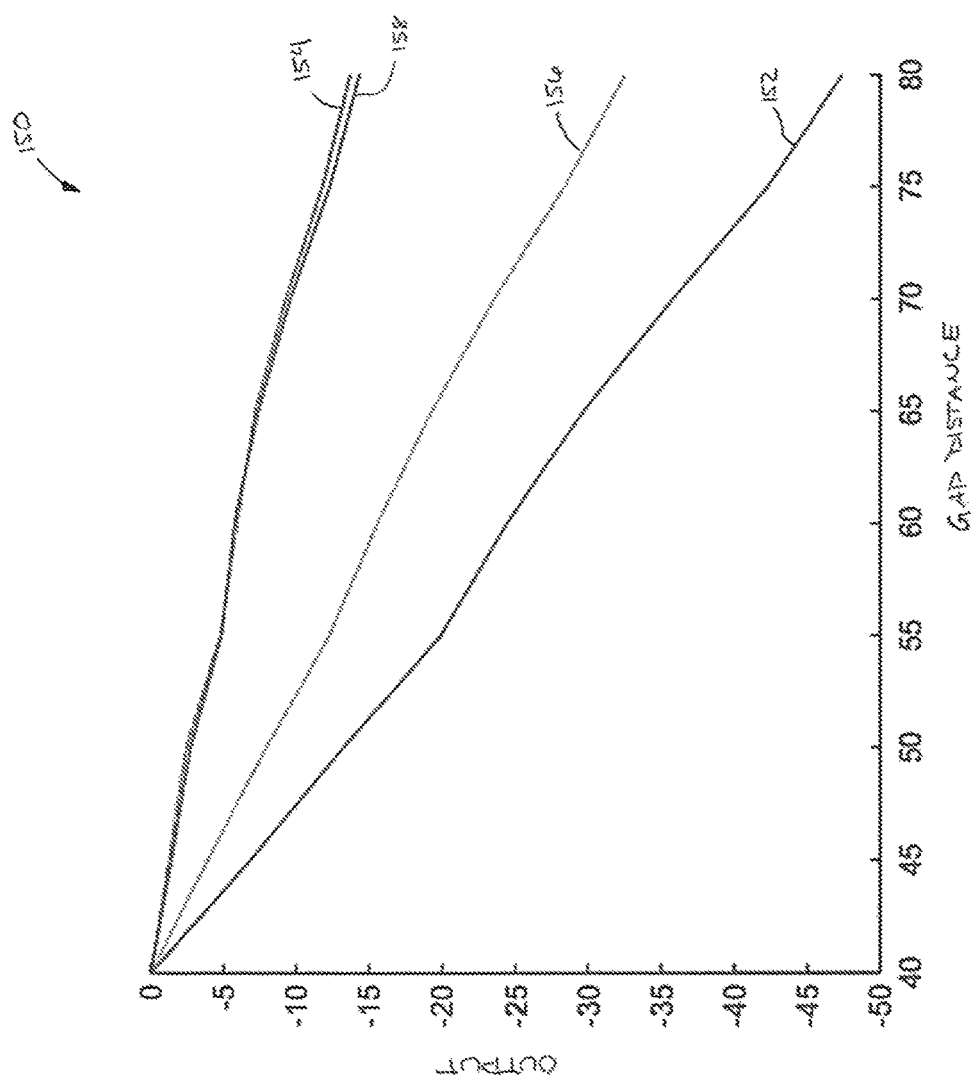
FIG. 8 is an exemplary plot of output versus air gap distances for the plurality of detector pole elements of the sensor head shown in FIG. 1.

FIG. 8 is an exemplary plot 150 of output versus air gap 16 distances for detector pole elements 40, 42, 44, and 46 (shown in FIG. 1) of sensor head 14 (shown in FIG. 1). In the exemplary embodiment, detector pole element pole signals 152, 154, 156, and 158 correspond to the output signal of detector pole elements 40, 42, 44, and 46, respectively. Detector pole element pole signals 152, 154, 156, and 158 show the output response of detector pole elements 40, 42, 44, and 46, respectively, after sensor head 14 is mechanically aligned to rotatable shaft 12 using, for example, and without limitation, a fixture to facilitate aligning sensor head 14 with rotatable shaft 12. As shown in FIG. 8, detector pole element pole signals 154 and 158, from detector pole elements 42 and 46, are substantially similar, indicating typically good alignment and a generally consistent air gap 16. Detector pole element pole signals 152 and 156, from detector pole elements 40 and 44, however, need to be adjusted relative to rotatable shaft 12 (shown in FIG. 1) to facilitate collapsing or aligning the pole elements to rotatable shaft 12. For example, and without limitation, the yaw of sensor head 14 can be adjusted to facilitate adjusting detector pole element pole signals 154 and 158, from detector pole elements 42 and 46, to bring them between, or sandwich them between, detector pole element pole signals 152 and 156, from detector pole elements 40 and 44.

Figure 9:
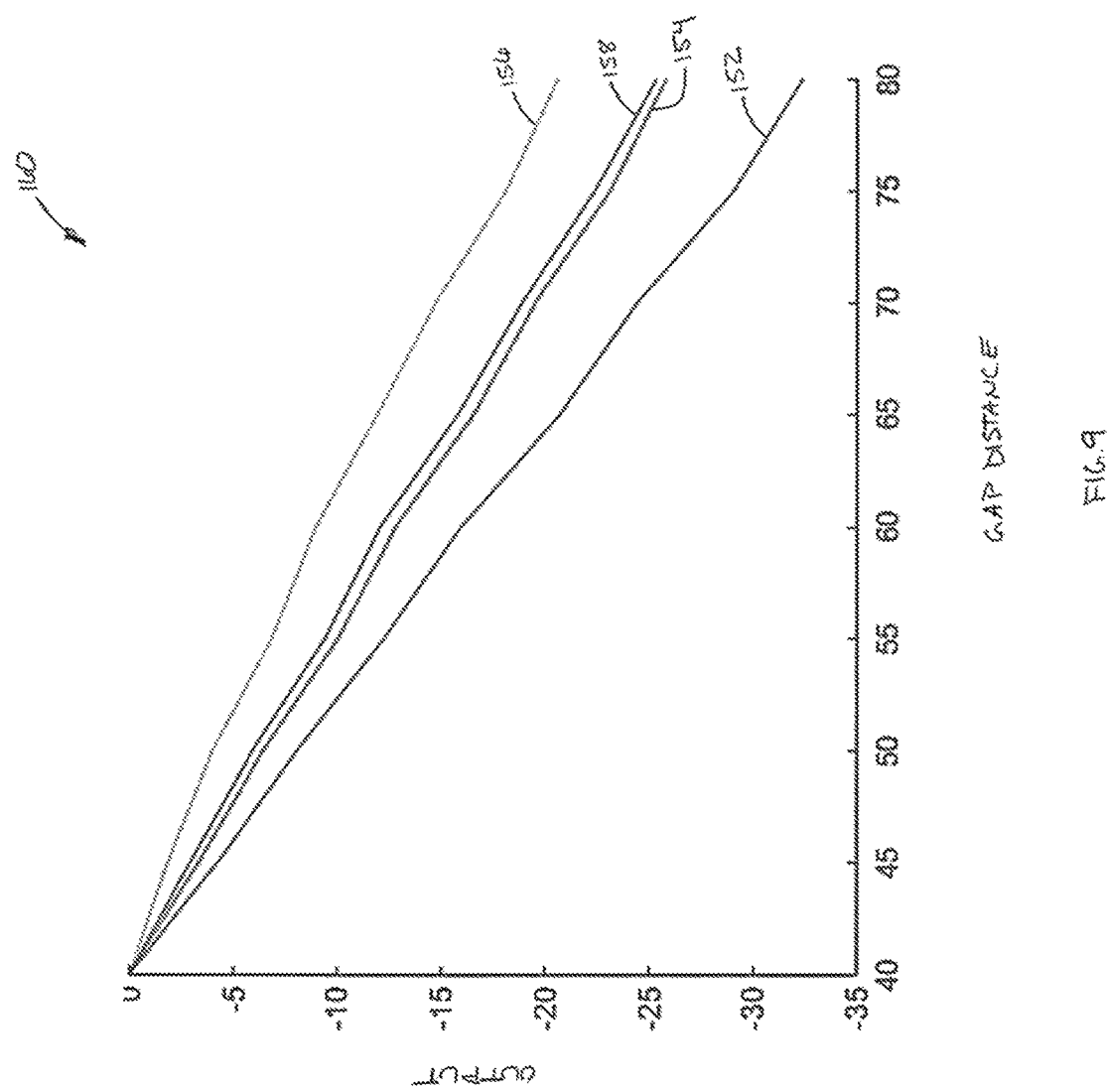
FIG. 9 is an exemplary plot of output versus air gap distances for the plurality of detector pole elements of the sensor head shown in FIG. 1 and after yaw adjustment of the sensor head.

FIG. 9 is an exemplary plot 160 of output versus air gap 16 distances for detector pole elements 40, 42, 44, and 46 (shown in FIG. 1) of sensor head 14 (shown in FIG. 1) after yaw adjustment of sensor head 14 of FIG. 8. In the exemplary embodiment, after adjusting the yaw of sensor head 14, detector pole element pole signals 154 and 158, from detector pole elements 42 and 46, are moved to a location between detector pole element pole signals 152 and 156, from detector pole elements 40 and 44. As shown in plot 160, air gap 16 between detector pole elements 42 and 46 increased, as indicative of the output being more negative relative to plot 150, and air gap 16 between detector pole elements 40 and 44 decreased. However, as indicated in plot 160, detector pole element 40 is closer to rotatable shaft 12 (shown in FIG. 1) and needs to be moved further away from rotatable shaft 12. Detector pole element 44, in contrast, needs to be moved closer to rotatable shaft 12. This can be accomplished by rotating sensor head 14 about the X axis. Rotating sensor head 14 about the X axis may facilitate aligning detector pole elements 40 and 44 or bringing detector pole element pole signals 152 and 156 closer together. It does not facilitate aligning detector pole element pole signals 152 and 156 with detector pole element pole signals 154 and 158. That can be accomplished using the yaw adjustment.

Figure 10:
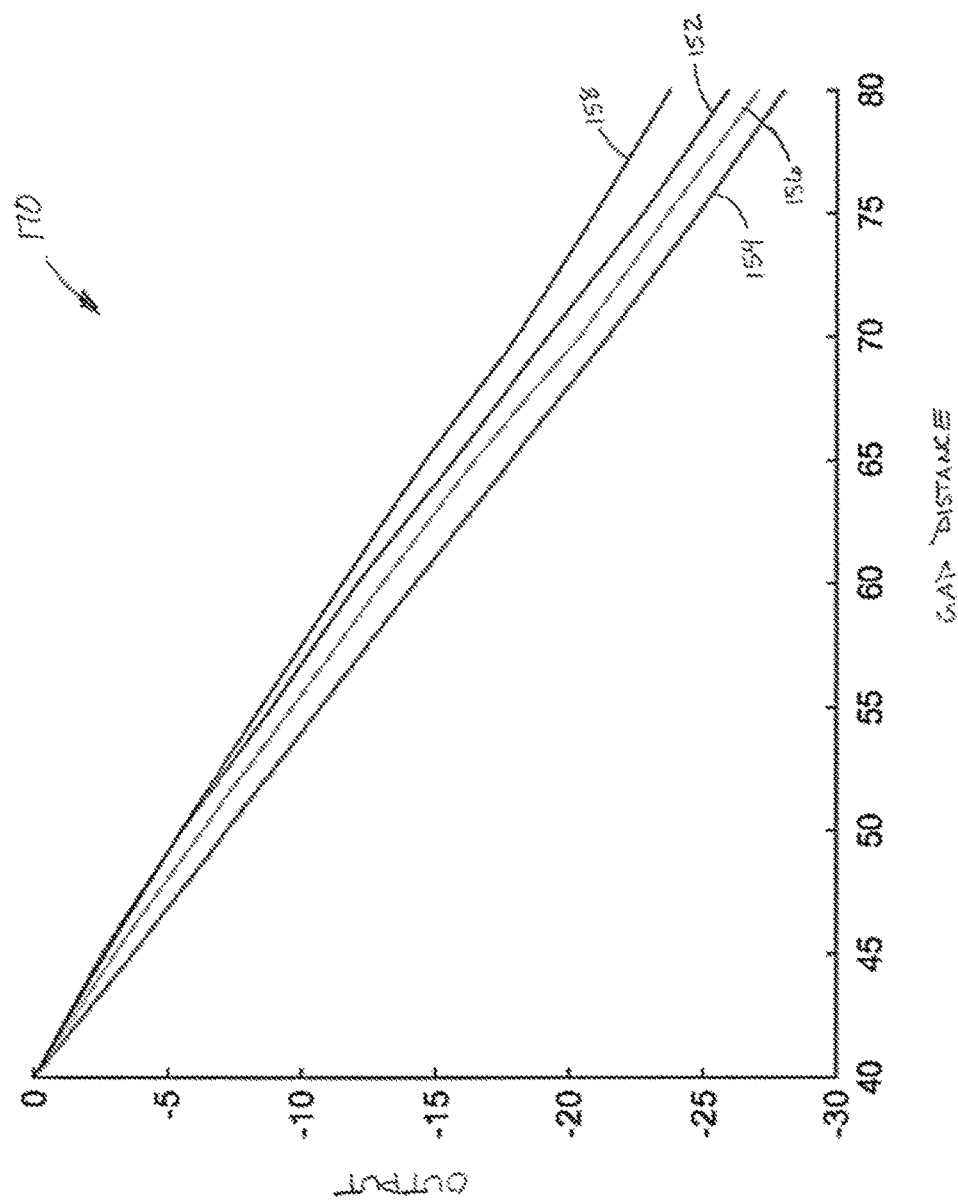
FIG. 10 is an exemplary plot of output versus air gap distances for the plurality of detector pole elements of the sensor head shown in FIG. 1 and after yaw and pitch adjustment of the sensor head.

FIG. 10 is an exemplary plot 170 of output versus air gap 16 distances for detector pole elements 40, 42, 44, and 46 (shown in FIG. 1) of sensor head 14 (shown in FIG. 1) after yaw and pitch adjustment of sensor head 14 of FIGS. 7 and 8. In the exemplary embodiment, rotating sensor head 14 about the X axis can facilitate moving detector pole element 44 closer to rotatable shaft 12 (shown in FIG. 1) and moving detector pole element 40 further away from rotatable shaft 12. As shown in FIG. 10, detector pole element pole signals 152 and 156 are closer together, and are positioned between detector pole element pole signals 154 and 158. It is noted that additional fine tuning of sensor head 14 by repeating the yaw and pitch adjustments may facilitate bringing detector pole element pole signals 152, 154, 156, and 158 further into alignment, however, as described herein, controller 18 may be configured to accommodate the different voltage outputs of detector pole elements 40, 42, 44, and 46, to compensate for the slight differences in air gap 16 indicated in FIG. 10. In particular, controller 18 may include a gap compensation algorithm that facilitates correcting errors in alignment of sensor head 14.

Figure 11:
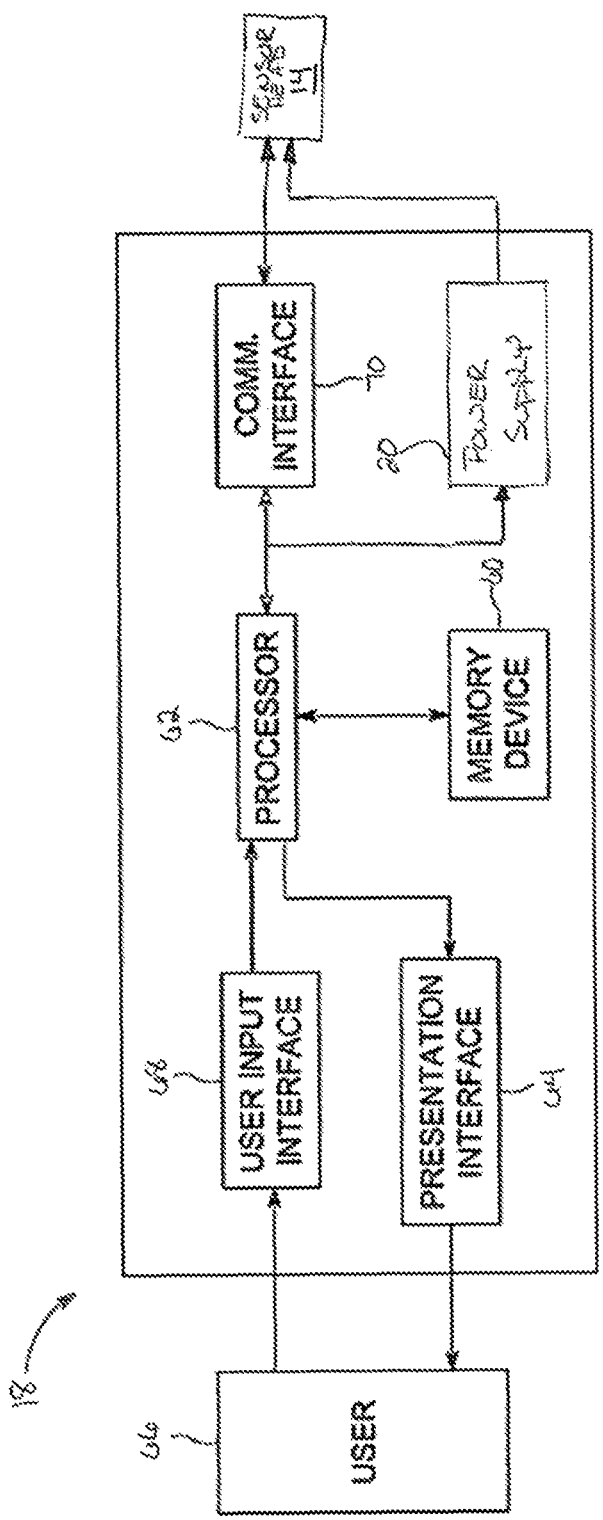
FIG. 11 is a block diagram of an exemplary controller that may be used to operate the stress sensing system shown FIG. 1.
Figure 13:
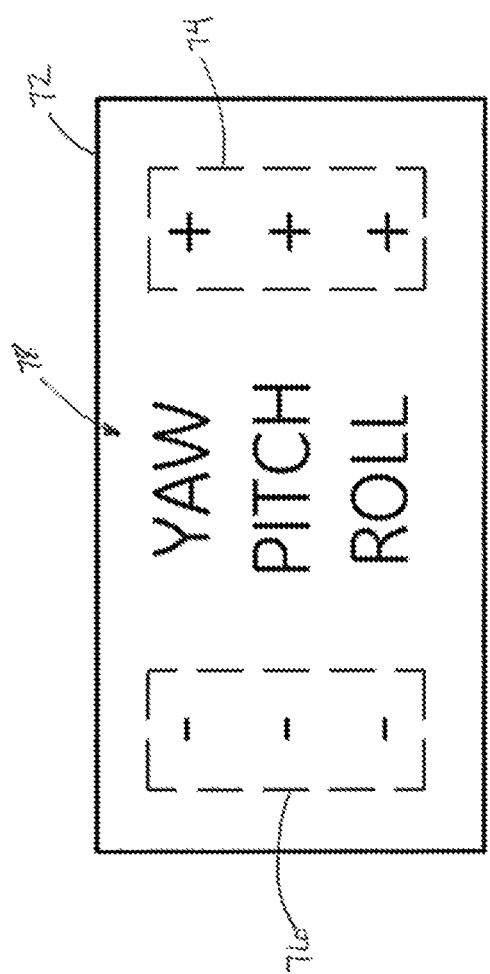

FIG. 11 is a block diagram of controller 18 that can be used to operate stress sensing system 10 (shown in FIG. 1). In the exemplary embodiment, controller 18 can be one of any type of controller typically provided by a manufacturer of stress sensing system 10 to control operation of stress sensing system 10. Controller 18 may execute operations to control the operation of stress sensing system 10 based at least partially on instructions from human operators. Operations executed by controller 18 typically include controlling power output of excitation pole element 36 and receiving detector pole element pole signals, such as signals 152, 154, 156, and 158, from detector pole elements 40, 42, 44, and 46, respectively. In some embodiments, controller 18 may also adjust a position of sensor head 14 (shown in FIG. 1) by providing adjustment signals to adjustment apparatus 110 (shown in FIG. 5), and/or transmit output signals corresponding to the determined amount of adjustment to a presentation device. In other embodiments, controller 18 may also provide instructions to a user for manually moving adjustment apparatus 110.

In the exemplary embodiment, controller 18 typically includes a memory device 60 and a processor 62 coupled to memory device 60. Processor 62 may include one or more processing units, such as, without limitation, a multi-core configuration. Processor 62 can be any type of processor that permits controller 18 to operate as described herein. In some embodiments, executable instructions can be stored in memory device 60. Controller 18 can be configurable to perform one or more operations described herein by programming processor 62. For example, processor 62 may be programmed by encoding an operation as one or more executable instructions and providing the executable instructions in memory device 60. In the exemplary embodiment, memory device 60 can be one or more devices that enable storage and retrieval of information such as executable instructions or other data. Memory device 60 may include one or more computer readable media, such as, without limitation, random access memory (RAM), dynamic RAM, static RAM, a solid-state disk, a hard disk, read-only memory (ROM), erasable programmable ROM, electrically erasable programmable ROM, or non-volatile RAM memory. The above memory types are exemplary only, and are thus not limiting as to the types of memory usable for storage of a computer program.

Memory device 60 may be configured to store any type of data, including, without limitation, detector pole element pole signals 152, 154, 156, and 158 associated with detector pole elements 40, 42, 44, and 46, respectively. In some embodiments, processor 62 can remove or "purge" data from memory device 60 based on the age of the data. For example, processor 62 may overwrite previously recorded and stored data associated with a subsequent time or event. In addition, or alternatively, processor 62 may remove data that exceeds a predetermined time interval. In addition, memory device 60 can include, without limitation, sufficient data, algorithms, and commands to facilitate monitoring of sensor head 14 and in particular detector pole element pole signals 152, 154, 156, and 158 being generated by stress sensing system 10.

In some embodiments, controller 18 includes a presentation interface 64 coupled to processor 62. Presentation interface 64 can present information, such as an amount of adjustment of sensor head 14 and operating conditions of stress sensing system 10, to a user 66. In one embodiment, presentation interface 64 can include a display adapter (not shown) coupled to a presentation device, such as presentation device 72 (shown in FIG. 12). Presentation device 72 can include such devices as a cathode ray tube (CRT), a liquid crystal display (LCD), an organic LED (OLED) display, or an "electronic ink" display. In some embodiments, presentation interface 64 can include one or more presentation devices. In addition, or alternatively, presentation interface 64 can include an audio output device (not shown), for example, without limitation, an audio adapter or a speaker (not shown).

In some embodiments, controller 18 can include a user input interface 68. In the exemplary embodiment, user input interface 68 can be coupled to processor 62 and can receive input from user 66. User input interface 68 may include, for example, without limitation, a keyboard, a pointing device, a mouse, a stylus, a touch sensitive panel, such as, without limitation, a touch pad or a touch screen, and/or an audio input interface, such as, without limitation, a microphone. A single component, such as a touch screen, may function as both a presentation device of presentation interface 64 and user input interface 68.

In the exemplary embodiment, a communication interface 70 can be coupled to processor 62 and can be configured to be coupled in communication with one or more other devices, such as sensor head 14, and to perform input and output operations with respect to such devices while performing as an input channel. For example, communication interface 70 may include, without limitation, a wired network adapter, a wireless network adapter, a mobile telecommunications adapter, a serial communication adapter, or a parallel communication adapter. Communication interface 70 may receive a data signal from or transmit a data signal to one or more remote devices. For example, in some embodiments, communication interface 70 of controller 18 may transmit/receive a data signal to/from adjustment apparatus 110 and/or sensor head 14.

Presentation interface 64 and communication interface 70 can be both capable of providing information suitable for use with the methods described herein, such as, providing information to user 66 or processor 62. Accordingly, presentation interface 64 and communication interface 70 may be referred to as output devices. Similarly, user input interface 68 and communication interface 70 can be capable of receiving information suitable for use with the methods described herein and may be referred to as input devices.

FIG. 12 is a schematic of an exemplary presentation device 72 of controller 18 (shown in FIG. 11). In the exemplary embodiment, presentation device 72 typically includes a column of positive indicators 74 and a column of negative indicators 76. In the exemplary embodiment, indicators 74 and 76 can be light emitting diodes (LEDs). Alternatively, indicators 74 and 76 can be any type of indicator that enables presentation device 72 to function as described herein, for example, and without imitation, incandescent bulbs, OLEDs, and/or an LCD. Positioned between indicators 74 and 76 can be a column of adjustments 78, each row of adjustments aligned with a respective row of indicators 74 and 76. In the exemplary embodiment, the column of adjustments 78 may include a row labelled "YAW," a row labelled "PITCH," and a row labeled "ROLL." Positive indicators 74 may include lighted "+" symbols and negative indicators 76 may include lighted "−" symbols. In the exemplary embodiment, as air gap 16 of sensor head 14 is changed, controller 18 can be configured to present to a user an indication of positive or negative amounts of yaw, pitch, and roll of sensor head 14 to facilitate aligning sensor head 14 with rotatable shaft 12. While "+" symbols and "−" symbols are shown in FIG. 12 for indicators 74 and 76, it is contemplated that presentation device 72 can provide any type of indication of an amount of movement of sensor head 14 that enables stress sensing system 10 to function as described herein.

In contrast to known magnetostrictive sensors, the stress sensing system described herein facilitates aligning a stress sensor with a conductive target material to facilitate generally equalizing an air gap between each of the detector poles of the sensor head. Specifically, the stress sensing system described herein facilitates measuring an output, such as a voltage, from each of the sensor head's detector poles and providing an indication of an amount of yaw to apply to the sensor head to substantially equalize the voltages. In addition, after adjusting the yaw of the sensor head, the system described herein sweeps the sensor head through an air gap change and determines an alignment of the sensor head. The system then provides an indication of an amount of pitch about one or more of the pole axes of the sensor head. Therefore, in contrast to known magnetostrictive sensor systems, the stress sensing system as described herein facilitates increasing the alignment of the sensor head with the conductive target material to facilitate improving accuracy of the sensor head and facilitating increasing the ease of calibration of the magnetostrictive sensor system.

An exemplary technical effect of the systems and methods described herein includes at least one of (a) inducing a conditioning magnetic flux in a conductive target material; (b) sweeping the sensor head through an air gap change while detecting changes in the magnetic flux from each of the sensor head detector poles; (c) adjusting the magnetic flux field to change the magnetic state of the sensor system; (d) determining an alignment of the sensor head; and (e) providing an indication of an amount of adjustment of the sensor head to align the sensor head with the conductive target material.

While the disclosure has been described in detail in connection with only a limited number of embodiments, it should be readily understood that the disclosure is not limited to such disclosed embodiments. Rather, the disclosure can be modified to incorporate any number of variations, alterations, substitutions, or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description, but is only limited by the scope of the appended claims.

The methods and systems described herein are not limited to the specific embodiments described herein. For example, components of each system and/or steps of each method may be used and/or practiced independently and separately from other components and/or steps described herein. In addition, each component and/or step may also be used and/or practiced with other assemblies and methods.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), and/or any other circuit or processor capable of executing the functions described herein. The methods described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term processor.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for aligning a sensor with a conductive target material, said method comprising:
   inducing a first magnetic flux in the conductive target material to generate a first magnetic field state;
   receiving a first signal at a first signal output level from a first detector of the sensor and a second signal at a second signal output level from a second detector of the sensor at the first magnetic field state;
   inducing a second magnetic flux in the conductive target material to generate a second magnetic field state;
   receiving a third signal at a third signal output level from the first detector of the sensor and a fourth signal at a fourth signal output level from the second detector of the sensor at the second magnetic field state; and
   adjusting, based on changes in the signal output levels and in response to an adjustment signal provided by a controller, a position of the sensor relative to the conductive target material to adjust the signal output levels to desired levels.

2. A method in accordance with claim 1, wherein adjusting a position of the sensor comprises adjusting the position of the sensor in at least one of a linear and a rotational direction.

3. A method in accordance with claim 1, wherein adjusting a position of the sensor comprises:
   coupling the sensor to an adjustment apparatus; and
   adjusting the adjustment apparatus in at least one of a linear and a rotational direction.

4. A method in accordance with claim 1, wherein inducing the second magnetic flux in the conductive target material comprises adjusting a relative gap between the sensor and the conductive target material.

5. A method in accordance with claim 1, wherein inducing the first magnetic flux in the conductive target material comprises actuating an excitation source to generate the first magnetic flux in the conductive target material, and wherein inducing the second magnetic flux in the conductive target material comprises adjusting at least one of a signal frequency and signal voltage to actuate the excitation source.

6. A method for aligning a sensor with a conductive target material, said method comprising:
   adjusting a magnetic flux in the conductive target material to change a first magnetic field state to a second magnetic field state;
   detecting a first change in the magnetic flux using a first detector of a first pair of detectors of the sensor, wherein the first change in the magnetic flux corresponds to the change of the magnetic field state;
   detecting a second change in the magnetic flux using a second detector of the first pair of detectors of the sensor, wherein the second change in the magnetic flux corresponds to the change of the magnetic field state;
   comparing the first change in the magnetic flux to the second change in the magnetic flux; and
   adjusting, in response to an adjustment signal provided by a controller and based on the comparison of the first change in the magnetic flux to the second change in the magnetic flux, a position of the sensor to alter the relative position of the sensor to the conductive target material such that the first change and the second change are set to desired output levels.

7. A method in accordance with claim 6, wherein the sensor includes a second pair of detectors, said method further comprising:
   detecting a third change in the magnetic flux using a third detector of the second pair of detectors of the sensor, wherein the third change in the magnetic flux corresponds to the change of the magnetic field state;
   detecting a fourth change in the magnetic flux using a fourth detector of the second pair of detectors of the sensor, wherein the fourth change in the magnetic flux corresponds to the change of the magnetic field state;
   comparing the third change in the magnetic flux to the fourth change in the magnetic flux; and
   based on one or more of the comparison of the first change to the second change and the comparison of the third change to the fourth change, adjusting a position of the sensor to alter the relative position of the sensor to the conductive target material such that one or more of the first and second changes, and the third and fourth changes are set to desired output levels.

8. A method in accordance with claim 6 further comprising inducing the magnetic flux in the conductive target material.

9. A method in accordance with claim 8, wherein inducing the magnetic flux in the conductive target material comprises actuating an excitation source to generate the magnetic flux in the conductive target material, and wherein adjusting the magnetic flux comprises adjusting at least one of a signal frequency and signal voltage to actuate the excitation source.

10. A method in accordance with claim 8, wherein adjusting the magnetic flux in the conductive target material comprises changing a relative gap between the sensor and the conductive target material.

11. A method in accordance with claim 6, wherein adjusting the position of the sensor comprises adjusting the position of the sensor in at least one of a linear and a rotational direction.

12. A method in accordance with claim 6, wherein adjusting a position of the sensor comprises:
    coupling the sensor to an adjustment apparatus; and
    adjusting the adjustment apparatus in at least one of a linear and a rotational direction.

13. A system to aid in aligning a sensor to a conductive target material, said system comprising:
    a sensor positioned proximate to a conductive target material, said sensor comprising:
        an excitation source configured to induce a magnetic flux in the conductive target material; and
        at least two detectors, said at least two detectors comprising a first detector configured to detect said magnetic flux, and a second detector configured to detect said magnetic flux;
    an adjustment apparatus configured to adjust an orientation of said sensor relative to the conductive target material between a first orientation and a second orientation; and
    a controller coupled in communication with said sensor, said controller configured to:
        receive a first signal from said first detector and a second signal from said second detector at a first magnetic field state;
        receive a third signal from said first detector and a fourth signal from said second detector at a second magnetic field state; and
        based on a change in at least one of the first, second, third, and fourth signals, determine an amount of adjustment to move said adjustment apparatus from said first orientation to said second orientation.

14. A system in accordance with claim 13, wherein said controller comprises a presentation device configured to present to a user the amount of adjustment of said adjustment apparatus.

15. A system in accordance with claim 13, wherein said adjustment apparatus is configured to adjust the orientation of said sensor relative to the conductive target material in at least one of a linear and a rotational direction.

16. A system in accordance with claim 13, wherein said controller is further configured to transmit at least one adjustment signal to said adjustment apparatus to move said adjustment apparatus the determined amount of adjustment.

17. A system in accordance with claim 13, wherein said controller is further configured to transmit at least one adjustment signal to said adjustment apparatus to move said adjustment apparatus between said first orientation and a third orientation, wherein said first orientation corresponds to the first magnetic field state, and wherein the third orientation corresponds to the second magnetic field state.

18. A system in accordance with claim 13, wherein said controller is further configured to transmit at least one output signal corresponding to the determined amount of adjustment.

19. A system in accordance with claim 13, wherein said controller is further configured to present to a user an instruction for manually moving said adjustment apparatus at least a portion of the determined amount of adjustment.

20. A system in accordance with claim 13, wherein said controller configured to actuate said excitation source to generate the magnetic flux comprises said controller configured to actuate said excitation source to generate a first magnetic flux corresponding to the first magnetic field state, and a second magnetic flux corresponding to the second magnetic field state.

\* \* \* \* \*